United States Patent [19]
Gambino et al.

[11] Patent Number: 6,114,248
[45] Date of Patent: *Sep. 5, 2000

[54] PROCESS TO REDUCE LOCALIZED POLISH STOP EROSION

[75] Inventors: Jeffrey P. Gambino, Gaylordsville, Conn.; Mark A. Jaso, Yorktown Heights, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/007,907

[22] Filed: Jan. 15, 1998

[51] Int. Cl.[7] .......................... H01L 21/302; H01L 21/461
[52] U.S. Cl. ............................................. 438/692; 438/693
[58] Field of Search ..................................... 438/692, 693, 438/691, 5, 14

[56] References Cited

U.S. PATENT DOCUMENTS

| | | | |
|---|---|---|---|
| 3,170,273 | 2/1965 | Walsh et al. | |
| 3,552,071 | 1/1971 | Albanese et al. | |
| 3,715,842 | 2/1973 | Tredinnick et al. | |
| 3,738,881 | 6/1973 | Erdman et al. | |
| 4,113,551 | 9/1978 | Bassous et al. | |
| 4,671,851 | 6/1987 | Beyer et al. | |
| 4,889,586 | 12/1989 | Moguchi et al. | 438/693 |
| 4,892,612 | 1/1990 | Huff. | |
| 5,157,876 | 10/1992 | Medellin. | |
| 5,376,222 | 12/1994 | Miyajima et al. | 438/693 |
| 5,536,202 | 7/1996 | Appel et al. | |
| 5,575,837 | 11/1996 | Kodama et al. | 438/693 |
| 5,637,185 | 6/1997 | Murarka et al. | 438/693 |
| 5,637,513 | 6/1997 | Sugiyama | 438/311 |
| 5,733,819 | 3/1998 | Kodama et al. | 438/692 |
| 5,759,917 | 6/1998 | Grover et al. | 438/692 |
| 5,861,054 | 1/1999 | Miyashita et al. | 106/3 |
| 5,885,899 | 3/1999 | Armocost et al. | 438/697 |
| 5,911,111 | 6/1999 | Bohr et al. | 438/692 |

OTHER PUBLICATIONS

Greg C. Lee et al., "An In–Depth Characterization of Dishing and Erosion During Tungsten CMP", San Jose State University, Jun. 10–12, 1997, VMIC Conference, 1997 ISMIC—107/97/0304(c), pp. 304–306.

Matthew Rutten et al., "Pattern Density Effect in Tungsten CMP", Semiconductor International, pp. 123–128, Sep. 1995.

*Primary Examiner*—Benjamin L. Utech
*Assistant Examiner*—Duy-Vu Deo
*Attorney, Agent, or Firm*—Ratner & Prestia

[57] ABSTRACT

A process for reducing polish stop erosion includes using a slurry of particles and an alkaline solution. The slurry for reducing polish stop erosion has a reduced solids content, finer particle size, and an increased chemical component. The pH of the slurry is between about 9.5 and 10.5.

9 Claims, 5 Drawing Sheets

PROCESS TO REDUCE LOCALIZED POLISH STOP EROSION

TECHNICAL FIELD

The present invention relates generally to the field of semiconductors and, more particularly, to the chemical-mechanical polishing of semiconductor wafers with silica slurries.

BACKGROUND OF THE INVENTION

Doped polycrystalline Si is often used to fill contact holes or trench capacitors in dynamic random access memories (DRAMs). The polycrystalline Si can be patterned by chemical mechanical polishing (CMP), stopping on an underlying layer of patterned $Si_3N_4$, $SiO_2$, or other suitable materials.

CMP may be accomplished by mounting a wafer coated with polycrystalline silicon onto a carrier and putting it on a polishing machine. An appropriate polishing pad material is driven across the wafer surface. Then, a colloidal silica slurry of an alkaline solution and $SiO_2$ particles is contacted with the wafer. OH ions in the slurry react with Si atoms, catalyzing the corrosive action of water which results in the cleavage of Si back bonds. This is the mechanical part of the process. After polishing, the wafers are treated with certain chemical agents to remove the polishing slurry. Finally, the wafers are cleaned.

A polishing agent commonly used in the industry for silicon polishing is silica sol. U.S. Pat. No. 4,462,188 discloses the inclusion of up to 5% of an amine in the sol and the addition of a quaternary ammonium salt or base to the amine silica-sol combination. Also, it teaches the use of a silica sol that contains up to 5% of an amine and up to 5% of a quaternary ammonium salt or base.

The sol used in the polishing practices taught in the '188 patent is received with about 30 to 60% $SiO_2$. The required amine is added. The sol is diluted to about 3% $SiO_2$ (10 to 20 times) with water. The pH of the diluted sol is adjusted to a range of 10.5 to 11 with alkali metal or ammonium hydroxide. Potassium hydroxide is described as a preferred alkaline solution, and NaOH and $NH_4OH$ are described as less desirable. Specifically, with these solutions, a higher pH is required to improve stock removal, as shown in U.S. Pat. No. 4,549,374.

The sol is used to polish the device soon after dilution and pH adjustment, before the pH changes significantly. The pH has a tendency to decrease over time and as polishing proceeds. Both of these characteristics require that additional KOH be added to establish or sustain the desired removal rate of the layer.

It has been known in the art to polish silicon metal wafers by using a stable silica sol-amine combination that contains sufficient amine to provide a high pH on dilution. Also, the addition of alkali metal before and during the polishing process has been eliminated such that the only alkali metal present is that which is required during sol preparation.

Conventional slurries do not have reduced solids content because, generally, it is desirable to use as high a solids content as possible to maximize the polish rate. The prior art specifies certain solids content for slurries.

U.S. Pat. No. 3,715,842 describes a silica slurry, used to polish Si or Ge, that is stabilized with a cellulose derivative. The slurry is used in an alkaline solution. Nevertheless, the '842 patent does not recognize the problem of localized oxide erosion because the disclosed process was developed for Si wafer polishing. The proposed solids content in the '842 patent (1 to 50%) would cause considerable insulator erosion if used with the process of the present invention.

U.S. Pat. No. 3,552,071 describes polishing of Si using alkaline earth metal hydroxides, such as calcium hydroxide and strontium hydroxide, in the slurry. This slurry would not provide adequate selectivity to the underlying $SiO_2$ layer used in the present invention. The silica-based slurries are preferred because they provide high selectivity to the underlying $SiO_2$.

U.S. Pat. No. 3,552,071 describes polishing of Si using silica sols or gels. Although a silica slurry is used, it is not in an alkaline solution, which is necessary to achieve a high polish rate of Si. In addition, the solids content is relatively high (2 to 50%) and would cause localized erosion of the insulator.

U.S. Pat. No. 4,892,612 describes a silica slurry used to polish Si or Ge having amine additives to enhance the polish rate. Like in the present invention, a silica slurry is used in an alkaline solution. A low solids content is also specified, i.e. "less than 3% $SiO_2$." Nevertheless, the pH is relatively high (10.5 to 11) which would result in a higher oxide removal rate. A lower pH is preferred in order to minimize oxide erosion.

For patterning polysilicon, a colloidal silica slurry (sol) in an alkaline solution is typically used. The alkaline solution is a necessary component of the slurry which prevents the silica particles from agglomerating. This agglomeration could cause scratches in the surface to be polished and decreased polishing.

CMP is widely accepted as the preferred process for planarizing dielectrics and patterning tungsten (W) studs or polysilicon studs (particularly for specifications of 0.25 $\mu m$ and beyond) and other surfaces atop a silicon substrate. Nevertheless, CMP does encounter certain defects. These defects include pattern effects, such as oxide erosion and dishing, which increase with polish time and depend on the localized and adjacent patterns. Erosion has a specific pattern to it which seems related to pad bending or trapping of slurry in topography.

Improving the manufacturability and widening process margins in CMP by understanding and improving systematic degradations in performance such as pattern erosion and underlying oxide thickness variations is desired. These pattern effects depend on the specific choice of polisher parameters, consumables, and their effects.

As shown in FIG. 3A, erosion is the thinning of insulators and conductors in an array. Dishing is the thinning of a large feature (such as a conductor) near the center of the feature (as shown in FIG. 3B).

Patterning of W studs by CMP is in many ways similar to patterning of polysilicon studs by CMP, particularly because of the problems that are encountered. As shown in FIG. 4, oxide erosion during W CMP increases with polish time and is slightly higher at the wafer edges where the film removal is faster. When several arrays of vias are profiled, results, shown in FIG. 5, indicate that the edge array shows higher erosion compared to the center array but erosion in both cases is lower than an isolated array with the same via pattern density.

In the case of soft polishing pads, as shown in FIGS. 6, 7, and 8, the erosion pattern is rather specific, but similar to that reported earlier. This type of erosion tends to be preferentially higher towards the edge of a pattern array. FIGS. 6 and 7 show the erosion to be symmetric along the center of the array for isolated arrays or the center array, respectively. For an edge array, as shown in FIG. 8, erosion is higher near the periphery that is distant from the topography. These subtle erosion features may be caused by localized variations of pressure being applied on the wafer surface. First, pad bending is expected to be higher near the edge of an array as the pad encounters topography. Once over topography, the variation in the extent of subsequent pad bending is minimal. The peripheral erosion in an array may also be the result of the increased contribution to film removal from higher localized chemical or mechanical abrasion from the slurry trapped in patterns.

FIG. 1 shows the semiconductor device polished with conventional slurries and depicts an array 14 consisting of a polish stop layer 4 (such as $SiO_2$ or $Si_3N_4$) over a silicon wafer 2. Some examples are the formation of polysilicon studs in boro-polysilicate glass (BPSG) or polysilicon-filled trench capacitors in a $Si_3N_4$ pad nitride. These slurries cause defects such as edge erosion 8. The polysilicon studs 10 are also affected by the erosion 8. This erosion 8 creates troughs 6 at the edge of the array that can trap material during subsequent CMP steps, and hence cause leakage.

The deficiencies of the conventional processes and slurries show that a need still exists for a polishing process and slurry that will minimize edge erosion and corresponding defects. To overcome the shortcomings of the conventional processes and slurries, a new process and slurry are provided.

SUMMARY OF THE INVENTION

To meet this and other needs, and in view of its purposes, the present invention provides a process for minimizing insulator erosion at the edge of arrays during selective chemical-mechanical polishing of silicon wafers.

Another aspect of the present invention is a slurry for selective chemical-mechanical polishing having a solid component of abrasive particles and a liquid component of an alkaline solution. The slurry of the present invention has a reduced solids content and finer particle size of the abrasive to minimize the mechanical component of the polish, and, thus, reduce insulator erosion. The solids content of the slurry of the present invention is between about 0.2 and 0.4% and the particle size of the abrasive is between about 250 and 500 Å. A preferred slurry of the present invention has a pH between about 9.5 and 10.5

In another aspect of the present invention, the chemical component of the polish is increased by increasing the concentration of alkaline solution. This solution may be potassium or ammonium hydroxide, or amines. This allows for the maintenance of a high polish rate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
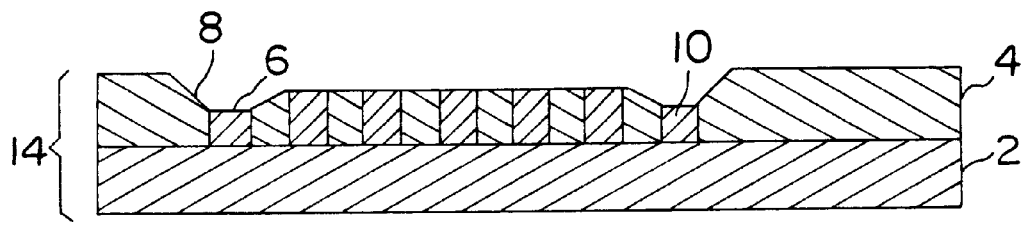
FIG. 1 is a planar view of a semiconductor substrate polished using conventional slurry compositions and processes.

The localized erosion problem discussed above is the main disadvantage to using a high solids content in the slurry. The process of the present invention overcomes this problem by reducing the solids content of the slurry and increasing the chemical component in the slurry.

Current chemical-mechanical planarization processes demonstrate the highly selective removal of polysilicon blanket films to either $SiO_2$ or $Si_3N_4$ films providing a polishing stop. For field areas on patterned wafers, the high selectivity remains intact. In array areas, the selectivity breaks down, resulting in the erosion of the insulator and polish stop. Large array areas of either polysilicon contact studs or trench capacitors show a tendency for accelerated erosion on the outside edge of the array, extending 5 to 15 microns into the device area. The depth of the erosion can measure up to 1,000 angstroms. The problem is independent of the stop layer or polishing pad.

This problem may be overcome by manipulating the chemical and mechanical components of the polishing slurry. By reducing the concentration of silicon dioxide abrasive and using a finer particle size abrasive, the erosion of the polish stop layers is reduced. Also, the polysilicon polishing process is strongly influenced by the chemistry of the slurry. By increasing the chemical component to balance the reduction of the abrasive, the polysilicon removal rate remains high with minimal degradation of the stopping layer.

A sol-amine combination that requires only dilution and avoids pH monitoring and adjustment would be considered a distinct and valuable improvement to the conventional process. To provide such a combination, additional alkaline materials would have to be added to the concentrated sol. Addition of substantial amounts of alkaline materials to concentrated sols has not been thought a reasonable approach, however, because the chemistry of silica sols does not encourage such additions.

Silica sols that contain more than 20% $SiO_2$ are carefully balanced colloidal systems stabilized by a combination of structured water layers surrounding the silica particles and a limited number of counter ions. The addition of alkaline bases or salts destabilizes these sols by disrupting the structured water layers and by the alkali attacking the silica polymer. These conditions cause the sol to become progressively more viscous and finally to gel.

Another solution to minimizing the array topography is to use a polishing slurry with no selectivity to the polysilicon and stop layers. By changing the chemical additive in the slurry from potassium hydroxide to ammonium hydroxide and using a larger particle size abrasive, the polysilicon to oxide removal rates are 1:1. This eliminates the preferential edge erosion found with the moderately selective slurries.

Nevertheless, the optimized slurry to reduce insulator erosion has a solids content of 0.2 to 0.4% by weight, with 0.3% being most preferred. This slurry uses a silica abrasive with a primary particle size of between approximately 250 and 500 Å, with 300 Å being most preferred. Sol gel colloidal silica or fumed colloidal silica can be used in the slurry.

An increase in the solids content with this particle size would result in increased erosion of the insulator and a reduction in the particle size reduces significantly the rate of erosion. For an adequate polysilicon removal rate, the pH of the slurry should be adjusted in the range of 9.5–10.5, with a pH of 9.8 being preferred. The chemical component can be adjusted with potassium hydroxide, ammonium hydroxide, or amines, all of which are commonly used in silicon polishing slurries.

Due to the reduction of solids in the slurry, a higher level of chemicals is required for the adequate removal of polysilicon required for semiconductor device applications. For ammonium hydroxide, a suitable level would be a volume concentration of 1.2 to 2.0%, with 1.5% being preferred. This is a higher concentration (approximately twice as high) than in normal polishing slurries.

Figure 2:
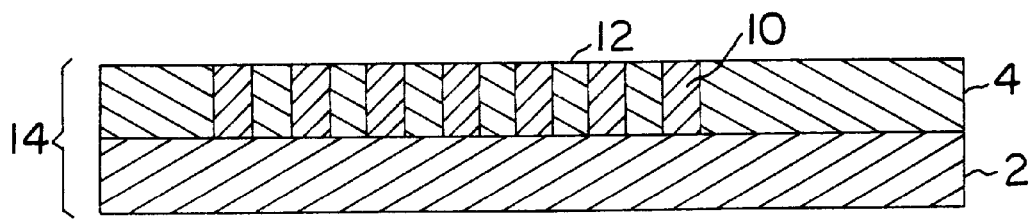
FIG. 2 is a planar view of a semiconductor substrate polished using the slurry composition and process of the present invention.
Figure 3A:
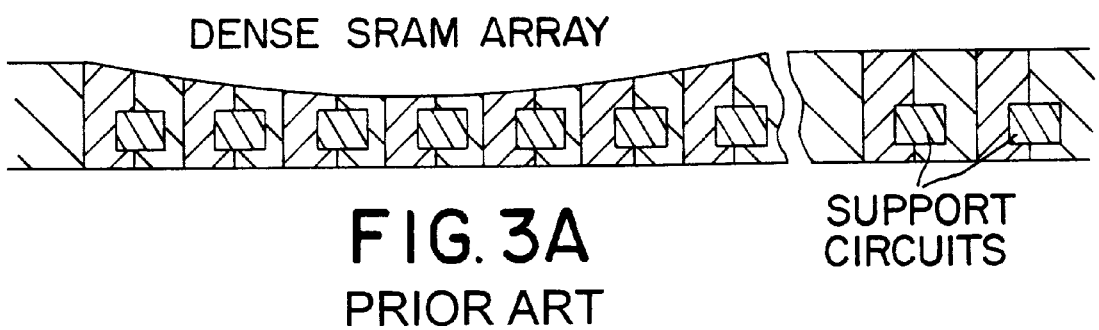
FIGS. 3A and 3B depict oxide erosion and dishing during CMP using conventional processes and slurries.
Figure 3B:
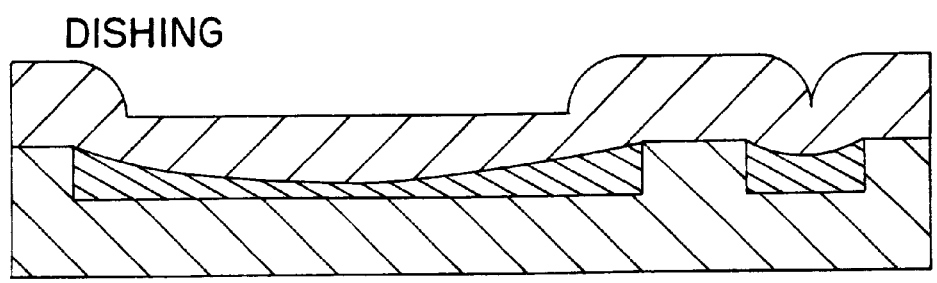
Figure 4:
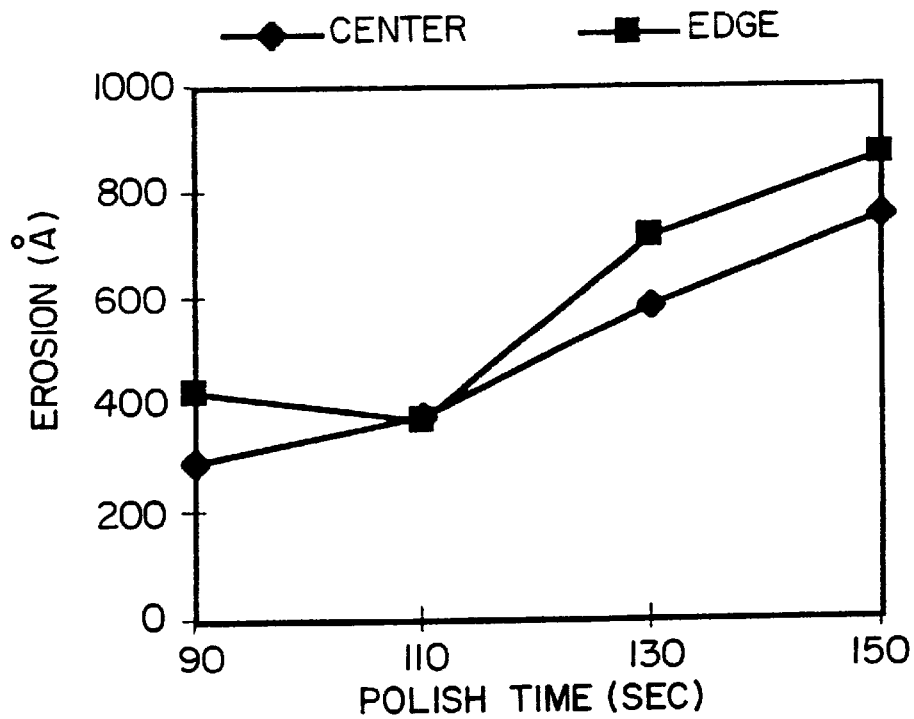
FIG. 4 is a graph showing oxide erosion as a function of polish time during CMP for the center and edge arrays of a wafer using conventional processes and slurries.
Figure 5:
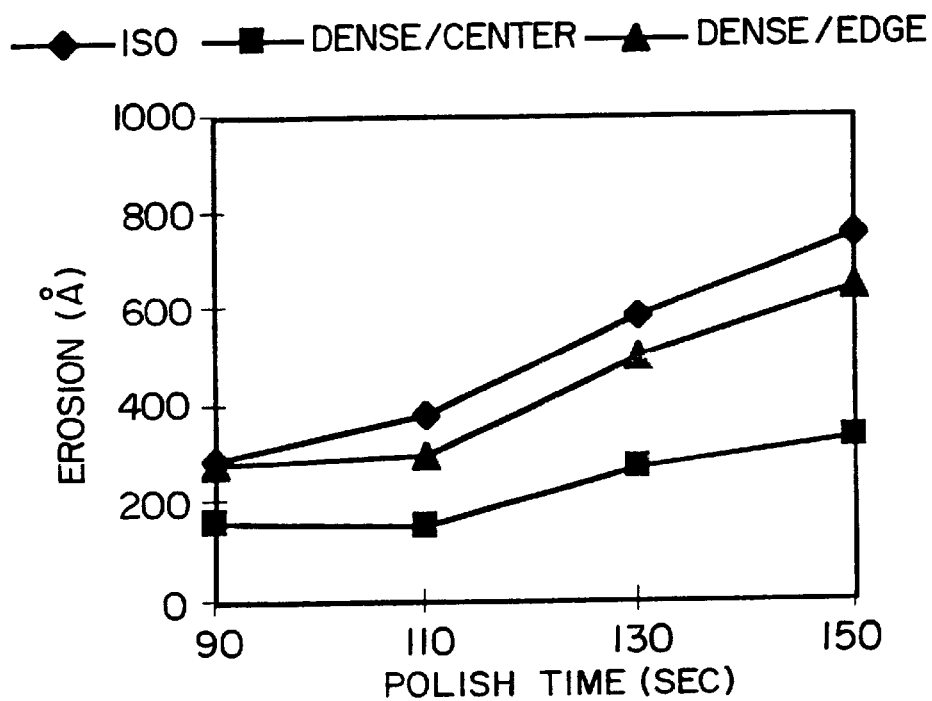
FIG. 5 is a graph showing oxide erosion as a function of polish time during CMP for the isolated, center, and edge arrays of a wafer using conventional processes and slurries.
Figure 6:
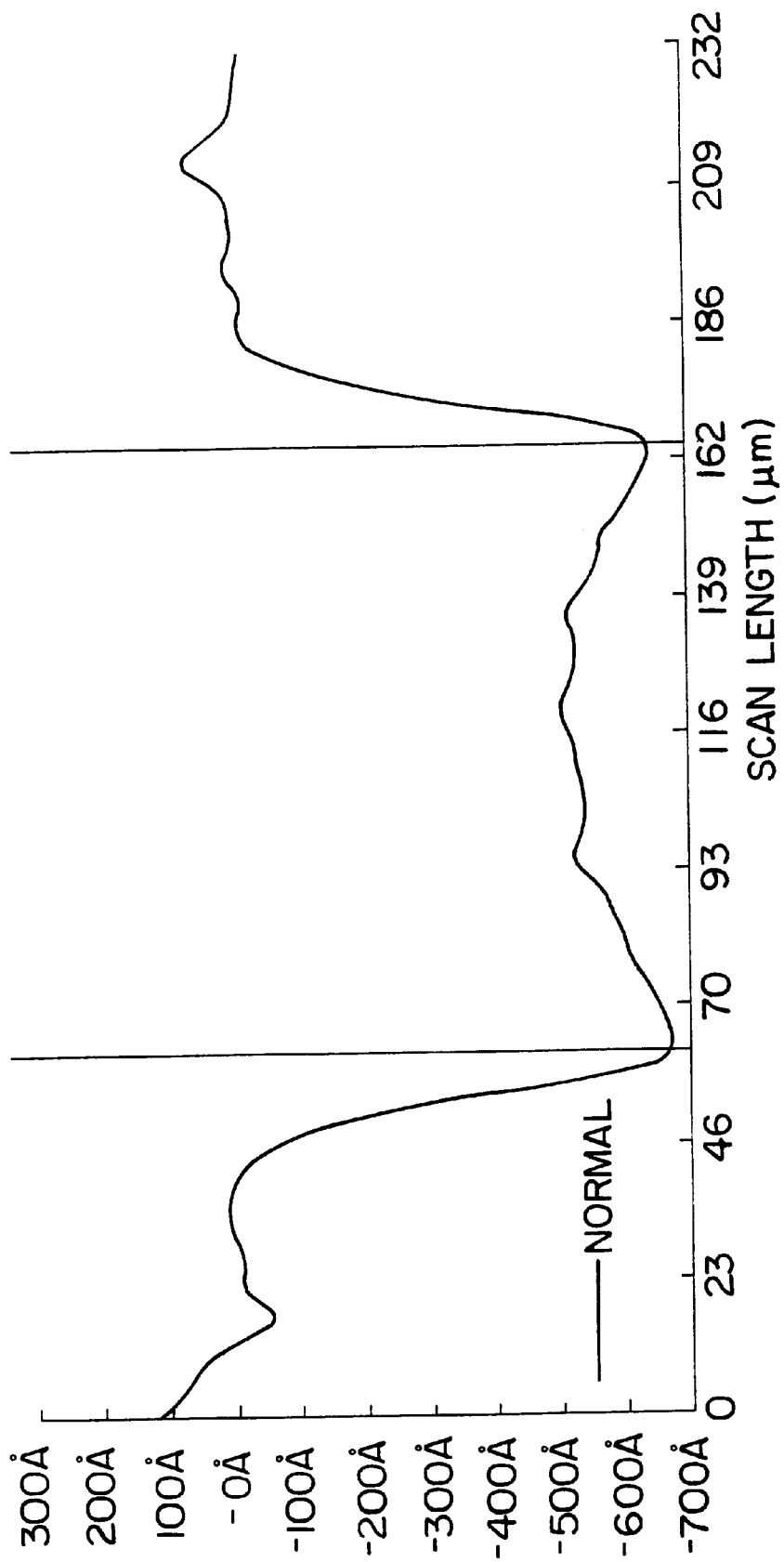
FIG. 6 is a graph showing the erosion profile for an isolated array of a wafer during CMP using conventional processes and slurries.
Figure 7:
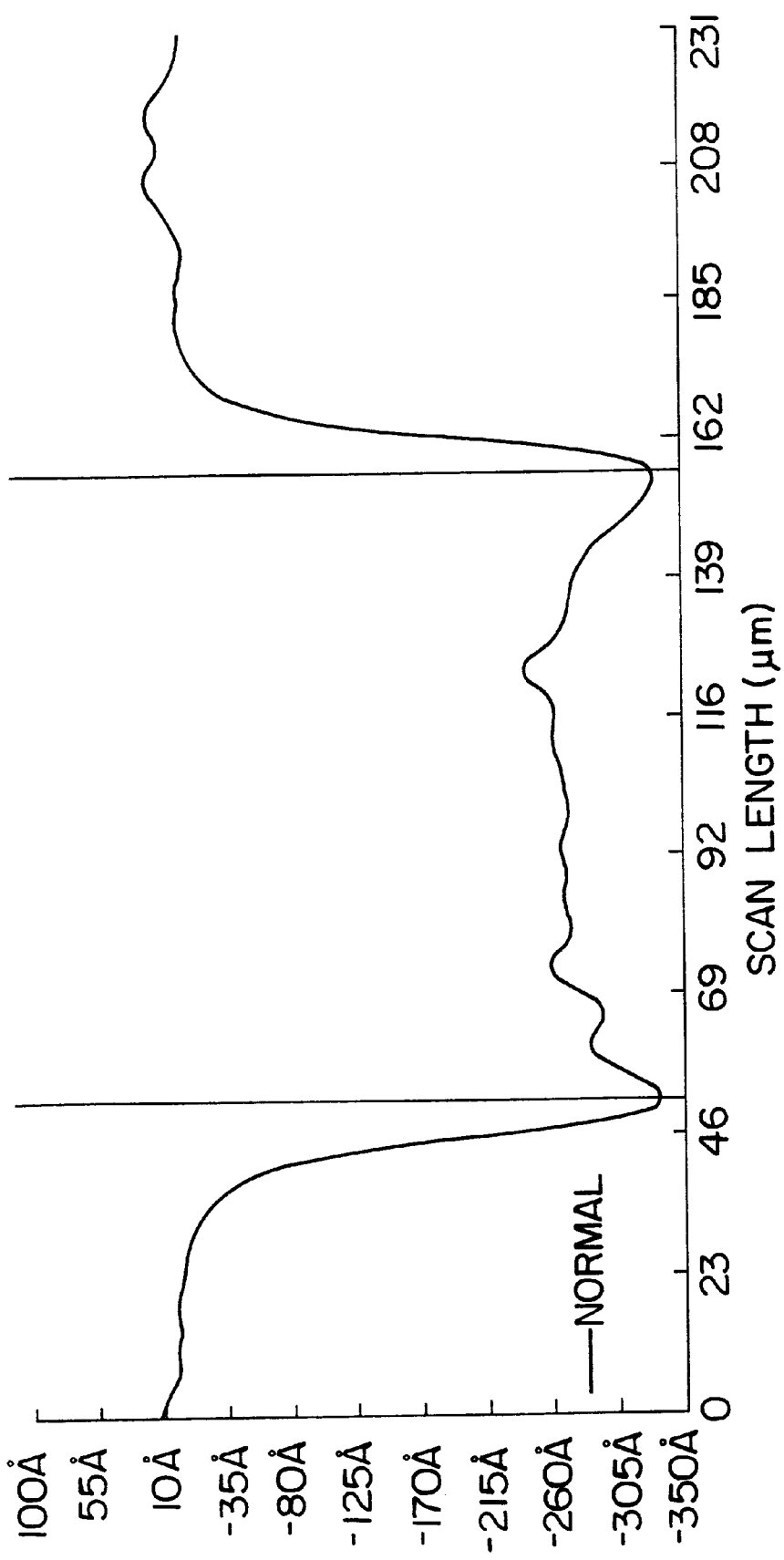
FIG. 7 is a graph showing the erosion profile for the center of a dense array of a wafer during CMP using conventional processes and slurries.
Figure 8:
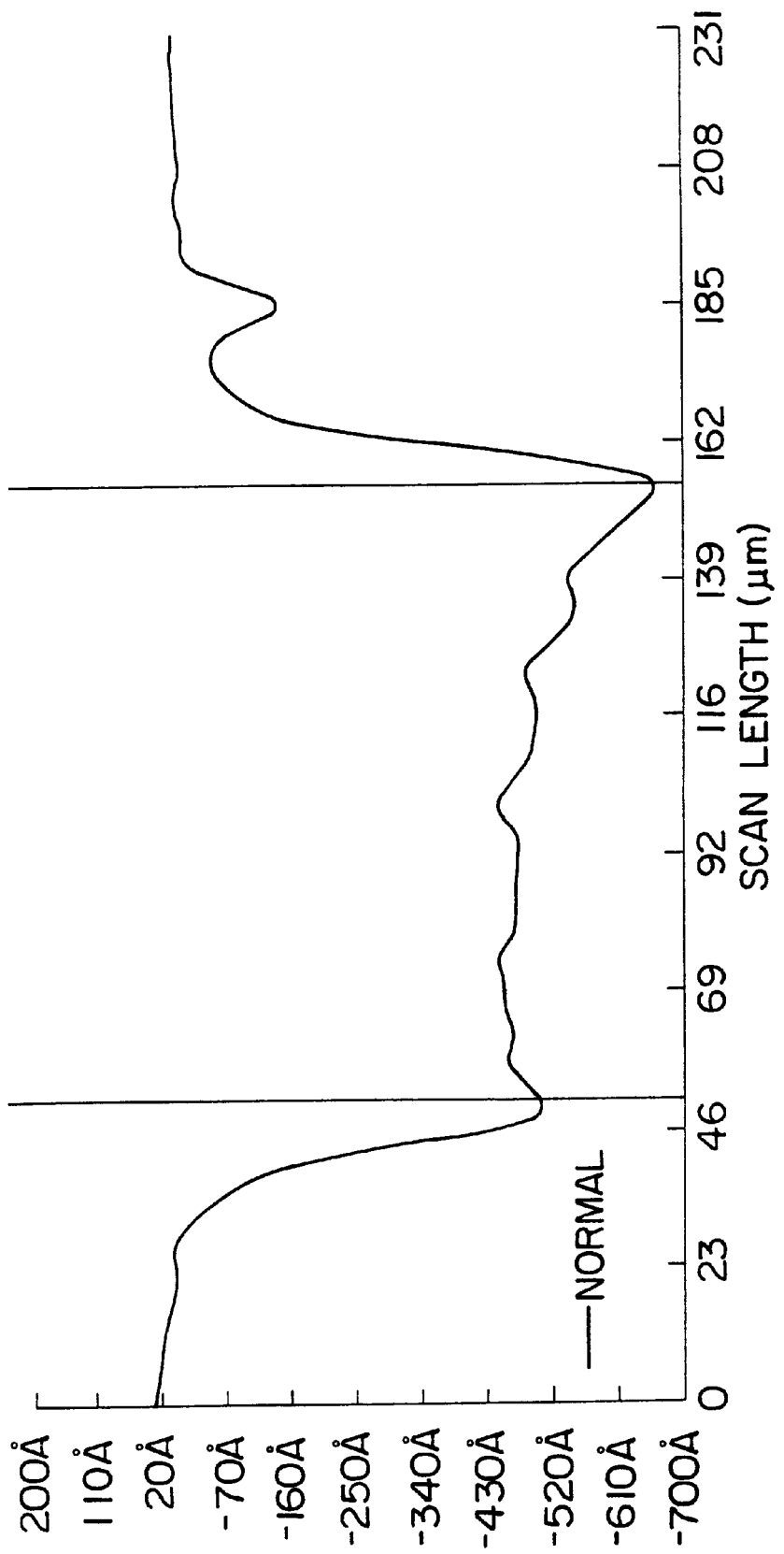
FIG. 8 is a graph showing the erosion profile for the edge of a dense array of a wafer during CMP using conventional processes and slurries.

FIG. 2 shows a silicon wafer 2 with a polish stop layer 4 deposited on the wafer 2, which form an array 14. It is polished using the slurry or process of the present invention. A flat, substantially defect-free surface 12 is obtained without the pattern effects or other defects, such as erosion, experienced with the use of conventional polishing slurries. In addition, as indicated above, the polysilicon 10 removal rate remains high.

As described above, a solution to the problem encountered from the slurries and processes of the prior art is to reduce the solids content of the slurry to minimize the mechanical component of the polish and, thus, insulator erosion is reduced. At the same time, the chemical component of the polish is increased by increasing the concentration of potassium, ammonium hydroxide, or amines, in order to maintain a high polish rate. Note that this approach (reducing the solids content of the slurry) has not been used before because it was believed desirable to use as high a solids content as possible to increase the polish rate.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for selectively polishing polycrystalline silicon filled vias or trenches stopping on an insulator comprising contacting a silicon wafer with a slurry selective for polycrystalline silicon, wherein said slurry includes from about 1.2% to about 2.0% by volume of an alkaline solution of at least one member from the group consisting of hydroxides and amines and solid particles being from about 0.2% to about 0.4% by weight of said slurry.

2. The process of claim 1 wherein said solid particles are about 0.3% by weight of said slurry.

3. The process of claim 1 wherein said alkaline solution is ammonium hydroxide.

4. The process of claim 3 wherein the volume concentration is about 1.5%.

5. The process of claim 1 wherein the size of said particles is from about 250 Å to about 500 Å and the pH of said slurry is from about 9.5 to about 10.5.

6. The process of claim 5 wherein said solid particles are about 0.3% by weight of said slurry, the size of said particles is about 300 Å, the pH of said slurry is about 9.8, and the alkaline solution is ammonium hydroxide with a volume concentration of about 1.5%.

7. A process for selectively polishing polycrystalline silicon filled vias or trenches stopping on an insulator comprising contacting a silicon wafer with a slurry selective for polycrystalline silicon, wherein said slurry includes from about 1.2% to about 2.0% by volume of an alkaline solution of at least one member from the group consisting of hydroxides and amines, with solid particles, said particles being selected from the group consisting of sol gel colloidal silica and fumed colloidal silica and being from about 0.2% to 0.4% by weight of said slurry, and the size of said particles is about 250 Å to about 500 Å.

8. The process of claim 7 wherein said alkaline solution includes at least one member from the group consisting of hydroxides and amines and has a volume concentration from about 1.2% to about 2.0%.

9. The process of claim 8 wherein the pH of said slurry is from about 9.5 to about 10.5.

* * * * *